United States Patent
Adelerhof et al.

(10) Patent No.: US 7,001,777 B1
(45) Date of Patent: Feb. 21, 2006

(54) METHOD OF MANUFACTURING A MAGNETIC TUNNEL JUNCTION DEVICE

(75) Inventors: Derk Jan Adelerhof, Eindhoven (NL); Reinder Coehoorn, Eindhoven (NL); Joannes Baptist Adrianus Dionisius Van Zon, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 187 days.

(21) Appl. No.: 09/787,457

(22) PCT Filed: Jul. 17, 2000

(86) PCT No.: PCT/EP00/06816

§ 371 (c)(1),
(2), (4) Date: Mar. 19, 2001

(87) PCT Pub. No.: WO01/07926

PCT Pub. Date: Feb. 1, 2001

(51) Int. Cl.
*H01L 21/00* (2006.01)

(52) U.S. Cl. .................... 438/3; 438/653; 365/173; 257/421

(58) Field of Classification Search ............ 438/3, 438/653, 783, 785, 971; 257/421, 424, 425, 257/422, 427, 295; 365/173
See application file for complete search history.

(56) References Cited

U.S. PATENT DOCUMENTS

| 5,650,958 | A | * | 7/1997 | Gallagher et al. | 365/173 |
|---|---|---|---|---|---|
| 5,949,622 | A | * | 9/1999 | Kamiguchi et al. | 360/324.12 |
| 6,365,948 | B1 | * | 4/2002 | Kumagai et al. | 257/421 |
| 6,486,662 | B1 | * | 11/2002 | Ruigrok et al. | 324/252 |
| 6,544,801 | B1 | * | 4/2003 | Slaughter et al. | 438/3 |
| 6,727,105 | B1 | * | 4/2004 | Brug et al. | 438/3 |

FOREIGN PATENT DOCUMENTS

| EP | 0594243 A2 | * | 4/1994 |
|---|---|---|---|
| WO | WO 97/16823 | * | 5/1997 |
| WO | WO9922368 | | 5/1999 |

OTHER PUBLICATIONS

Blamire et al. "A new Self-Aligning Process For Whole-Wafer Tunnel Junction Fabrication", Mar. 1989, IEEE, pp. 1123-1126.*

* cited by examiner

Primary Examiner—Maria F. Guerrero

(57) ABSTRACT

A method of manufacturing a magnetic tunnel junction device, in which a stack (1) comprising two magnetic layers (3, 7) and a barrier layer (5) extending in between is formed. One of the magnetic layers is structured by means of etching, in which, during etching, a part of this layer is made thinner by removing material until a rest layer (7r) remains. This rest layer is passivated by chemical conversion. In the relevant method, it is prevented that the magnetic layer which is not to be structured is detrimentally influenced during structuring of the other magnetic layer.

7 Claims, 2 Drawing Sheets

METHOD OF MANUFACTURING A MAGNETIC TUNNEL JUNCTION DEVICE

Figure 1A:
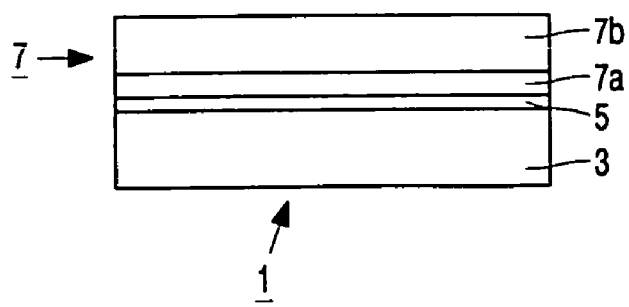

The invention relates to a method of manufacturing a magnetic tunnel junction device, in which a stack comprising two magnetic layers and a barrier layer extending in between is formed.

The invention also relates to a magnetic tunnel junction device obtainable by means of such a method, a magnetic field sensor provided with such a device and a magnetic memory provided with such a device.

A device as described above is disclosed in WO-A 99/22368. The magnetic tunnel junction device known from said patent application comprises a first and a second magnetic layer, which layers are sandwiched with respect to an insulating intermediate layer and serve as electrode layers. As a transducing element, this device forms part of a magnetic field sensor provided with a magnetic yoke, in which the first magnetic layer is in direct contact with a part of the yoke. The first magnetic layer, likewise as the yoke, is formed from a soft-magnetic material. The second magnetic layer is a composite layer and comprises a ferromagnetic sub-layer and a pinning structure. The insulating intermediate layer constitutes a tunnel barrier.

In the known magnetic tunnel junction device, one of the magnetic layers, namely the soft-magnetic layer, therefore also serves as a flux guide. To prevent detrimental effects on the magnetical properties of this layer, such as domain wall formation due to irregularities in the surface of the soft-magnetic layer facing the tunnel barrier, it is desirable that only the other magnetic layer, i.e. the second magnetic layer, and possibly the barrier-forming intermediate layer, is, or are, structured.

It is an object of the invention to provide a method of the type described in the opening paragraph, comprising a process of structuring one of the magnetic layers, which process stops with certainty before the other magnetic layer is reached.

To achieve the object described, the method according to the invention is characterized in that one of the magnetic layers is structured by means of etching, in which, during etching, a part of the relevant layer is made thinner by removing material until a rest layer remains, whereafter the electrical resistance of the rest layer is increased by chemical conversion. After performing the method according to the invention, a magnetic tunnel junction device is obtained in which one of the magnetic layers is structured and processed in such a way that unwanted electric currents in the structured layer obtained are inhibited during use. In principle, the other magnetic layer has remained unattacked.

In the method according to the invention, it is with certainty that the other magnetic layer is not reached, because the magnetic layer to be structured is not entirely etched off during said etching process in which use is made in known manner of a mask so as to shield a part of the magnetic layer to be structured, which is or may comprise a soft-magnetic layer. The rest of the etched part of this layer remaining after etching, referred to as the rest layer, is rendered poorly conducting by means of a chemical reaction, whereafter the structured magnetic layer, as well as the other magnetic layer, can be used as a magnetic electrode. Etching preferably takes place until the rest layer has reached a thickness of between 0 nm and 5 nm, in which process, for example, resistance measurements determine when the rest layer is reached. It has been found that the above-mentioned measures do not have any detrimental effects on said other magnetic layer; particularly, there is no detrimental influence on the magnetical properties of this magnetic layer. The method according to the invention also makes use of the advantage that the manufacturing margins are considerably wide when using non-selective etching techniques. If the last-mentioned layer is formed from or also from a soft-magnetic material, this layer is particularly suitable for use as a flux-guiding layer.

An embodiment of the method according to the invention is characterized in that the chemical conversion is effected by oxidation and/or nitridation. In this embodiment, the rest layer can be passivated in a simple manner by making use of known processes. An oxidation of the rest layer, in which material of the rest layer is converted into an oxide, is preferably realized by thermal oxidation, plasma oxidation or UV-assisted oxidation. A nitridation of the rest layer, in which material of the rest layer is converted into a nitride, is preferably realized by thermal nitridation or plasma nitridation. In the mentioned, known chemical processes, the desired oxidation or nitridation of the magnetic material of the rest layer can be obtained within a comparatively short time. If the barrier layer is an oxide layer, which is often the case, it will stop or decrease the oxidation in the rest layer at a given moment during performance of an oxidation process.

An embodiment of the method according to the invention is characterized in that physical etching is performed. Physical etching is understood to mean etching by means of a beam of electrically charged particles, such as sputter etching, ion milling and ion beam etching. These known etching methods have proved to be eminently suitable for the method according to the invention.

An embodiment of the method according to the invention is characterized in that the magnetic layer to be structured is built up from, consecutively, a basic layer and a layer structure comprising at least a further layer for magnetic pinning of the basic layer. The basic layer may be a ferromagnetic layer, for example, of an NiFe alloy or a Co alloy, particularly a Co—Fe alloy, while the pinning layer structure may comprise one of the following possibilities: an anti-ferromagnetic layer of, for example, an FeMn alloy or an IrMn alloy; a hard-magnetic ferromagnetic layer of, for example, a Co alloy; an artificial anti-ferromagnetic structure comprising two anti-parallel magnetic layers separated by a metallic intermediate layer. Such a structure may be coupled to an anti-ferromagnetic layer of, for example, an FeMn alloy. If such a magnetic layer to be structured is formed, it is preferred to selectively etch the layer structure, particularly selectively chemically etch this structure before etching, particularly physical etching takes place, until the basic layer is reached. By making partly use of said selective etching, the structuring process in accordance with the method according to the invention can be performed within a shorter period of time. Selective chemical etching is a known etching technique.

It is to be noted that the method according to the invention implies a method of structuring a magnetic electrode layer of a semi-manufactured product of a magnetic tunnel junction device, in which the semi-manufactured product comprises an assembly of said electrode layer, a barrier layer and a further magnetic electrode layer. In the last-mentioned method, the structuring of the relevant layer does not influence the magnetical properties of the other magnetic electrode layer of the magnetic tunnel junction device, at least not in a detrimental sense. The special aspect of this method, in which etching is used, is that etching does not take place as far as the barrier layer of the magnetic tunnel junction device, but the etching process is stopped at such an earlier moment that a rest layer remains on the barrier layer. It is thereby ensured that, in spite of layer thickness variations and variations of etching methods, the magnetic electrode layer, which is not to be structured, is not etched. The barrier layer, which is an insulating layer, a layer having a low electrical conductance, or an electric layer, is usually only approximately 1 nm thick.

The magnetic tunnel junction device according to the invention, manufactured by means of the method according to the invention, has a magnetic layer structured by means of this method and another magnetic layer which may be or may comprise a soft-magnetic layer, which layer is usable as a flux guide. Such a soft-magnetic layer may be formed from, for example, an NiFe alloy or a Co alloy such as a Co—Fe alloy. The soft-magnetic layer may also be built up from a number of sub-layers.

The magnetic field sensor according to the invention is provided with the magnetic tunnel junction device according to the invention. The magnetic tunnel junction device forms one or the transducing element of the magnetic field sensor according to the invention. This sensor may be used, inter alia, as a magnetic head for decoding magnetic flux originating from a magnetic information medium such as a magnetic tape or a magnetic disc; as a sensor in compasses for detecting the earth's magnetic field; as a sensor for detecting, for example, a position, an angle, or a velocity, for example, in automotive uses; as a field sensor in medical scanners; and as a current detector. Also the magnetic memory, particularly a MRAM, according to the invention is provided with the magnetic tunnel junction device according to the invention.

With regard to the claims, it is to be noted that various combinations of the embodiments mentioned in the dependent claims are possible.

These and other aspects of the invention are apparent from and will be elucidated with reference to the embodiments described hereinafter.

Figure 1B:
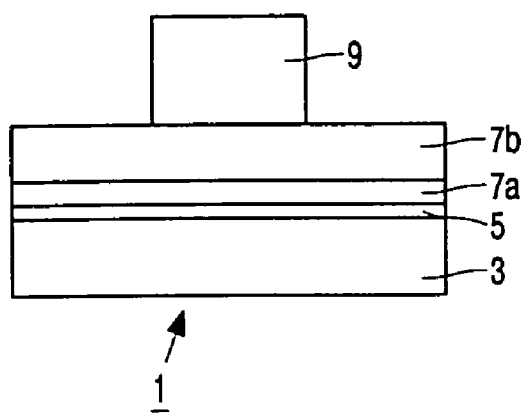
Figure 1C:
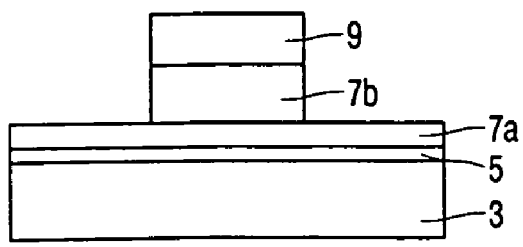
Figure 1D:
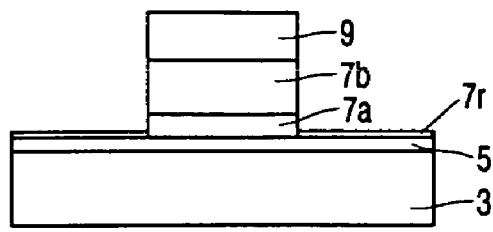
Figure 1E:
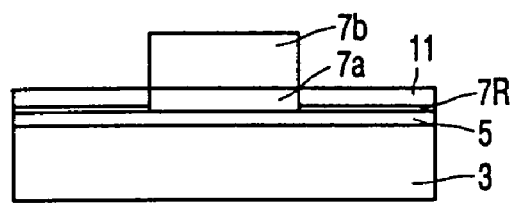
Figure 2:
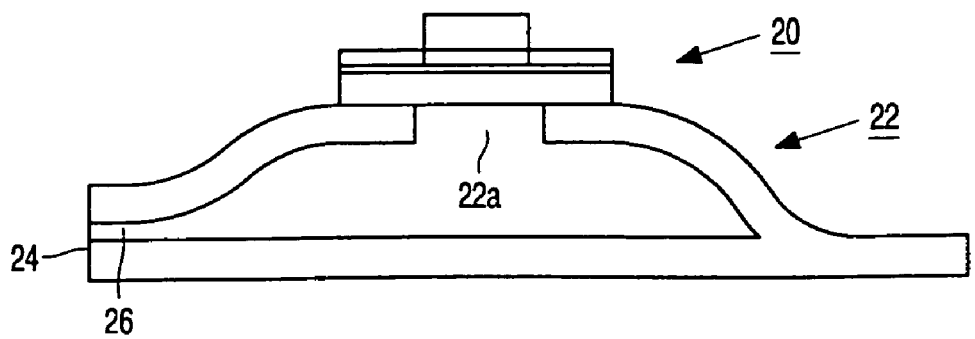

In the drawings:

FIG. 1A shows diagrammatically a first intermediate product obtained from an embodiment of the method according to the invention;

FIG. 1B shows diagrammatically a second intermediate product obtained from said embodiment of the method according to the invention, FIG. 1C shows diagrammatically a third intermediate product obtained from the embodiment of the method according to the invention, FIG. 1D shows diagrammatically a fourth intermediate product, FIG. 1E shows diagrammatically an embodiment of the magnetic tunnel junction device according to the invention, made in accordance with the described embodiment of the method according to the invention, and FIG. 2 shows an embodiment of the magnetic field sensor according to the invention.

FIG. 1A shows a stack 1 of layers which comprises, in this example, a first magnetic layer 3 of a soft-magnetic material, such as an NiFe alloy, an insulating, poorly conducting or dielectric layer 5, in this document also referred to as barrier layer, of, for example $Al_2O_3$, a second magnetic layer 7 built up in this example of a basic layer 7a of a soft-magnetic material, in this example an NiFe alloy, and a layer structure 7b comprising at least a further layer of an anti-ferromagnetic material such as an FeMn alloy. Alternatively, a hard-magnetic layer may be used as a second magnetic layer for the layer structure comprising the basic layer 7a and the layer structure 7b. During the method according to the invention, a shielding layer 9 of, for example, a photoresist, see FIG. 1B, is provided on the stack 1 shown. Subsequently, etching processes are used, in which the layer structure 7b is first etched selectively, particularly etched chemically, until the basic layer 7a is reached; see FIG. 1C. Subsequently, the basic layer 7a is etched, particularly etched physically, until a rest layer 7r of soft-magnetic material remains; see FIG. 1D. Alternatively, instead of two etching processes, it may be sufficient to use physical etching only, such as sputter etching. Physical etching is preferably also used if the second magnetic layer 7 is a hard-magnetic layer.

The rest layer 7r obtained in one of the methods described above preferably has a thickness of up to 5 nm maximum. During the method according to the invention, the rest layer 7r is exposed to oxidation in this embodiment so as to increase the electrical resistance of the relevant layer. The rest layer 7r is then converted into an oxide layer 7R which comprises Ni and Fe oxides in this example; see FIG. 1E. When using nitridation, a nitride layer 7R is obtained. In this example, thermal oxidation or plasma oxidation is preferably used for this conversion. By depositing an insulating material such as $SiO_2$, a protective layer 11 may be formed on the oxidation layer 7R. The shielding layer 9 may be removed.

The magnetic field sensor according to the invention, shown in FIG. 2, comprises a magnetic tunnel junction device 20 of the type shown in FIG. 1E. In this embodiment, the sensor also comprises a magnetic yoke 22 which has an interruption 22a which is bridged and is in magnetic contact with the tunnel junction device 20. The magnetic yoke 22 is formed from a soft-magnetic material such as an NiFe alloy. The sensor has a sensor face 24 adjacent to a non-magnetic transducing gap 26. The interruption 22a and the gap 26 are formed by insulating layers of, for example $SiO_2$ or $Al_2O_3$.

It is to be noted that the invention is not limited to the embodiments shown. For example, variants of the several steps of the method are possible within the scope of the invention. Furthermore, the sensor shown may be formed as a magnetic head for scanning a magnetic recording medium. Such a construction may form part of a combined read/write head. The magnetic tunnel junction device obtained in accordance with the method of the invention may also form part of a magnetic memory.

What is claimed is:

1. A method of manufacturing a magnetic tunnel junction device, in which a stack comprising two magnetic layers and a barrier layer extending in between is formed, one of the magnetic layers is structured by etching, in which, during etching, a part of the structured layer is thinned by removing material to provide a rest layer, whereafter the electrical resistance of the rest layer is increased by chemical conversion effected by oxidation and/or nitridation.

2. A method as claimed in claim 1, characterized in that an oxidation of the rest layer is effected by thermal oxidation, plasma oxidation or UV-assisted oxidation.

3. A method as claimed in claim 1, characterized in that a nitridation of the rest layer is effected by thermal nitridation or plasma nitridation.

4. A method as claimed in claim 1, characterized in that physical etching is performed.

5. A method as claimed in claim 1, characterized in that the magnetic layer to be structured is built up from, consecutively, a basic layer and a layer structure comprising at least a further layer for magnetic pinning of the basic layer.

6. A method as claimed in claim 4, characterized in that, the magnetic layer to be structured is built up from, consecutively, a basic layer and a layer structure, and prior to physical etching, the layer structure is chemically etched until the basic layer is reached.

7. A method as claimed in claim 5, characterized in that, prior to physical etching, the layer structure is chemically etched until the basic layer is reached.

* * * * *